(12) United States Patent
Lin et al.

(10) Patent No.: US 8,705,313 B2
(45) Date of Patent: Apr. 22, 2014

(54) DDR PSRAM AND DATA WRITING AND READING METHODS THEREOF

(71) Applicant: MediaTek Inc., Hsin-Chu (TW)

(72) Inventors: Chih-Hsin Lin, Taoyuan (TW);
Tsung-Huang Chen, New Taipei (TW);
Bing-Shiun Wang, Keelung (TW);
Jen-Pin Su, Zhubei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 14/054,249

(22) Filed: Oct. 15, 2013

(65) Prior Publication Data

US 2014/0043925 A1    Feb. 13, 2014

Related U.S. Application Data

(60) Division of application No. 13/403,689, filed on Feb. 23, 2012, which is a continuation-in-part of application No. 13/311,352, filed on Dec. 5, 2011, now Pat. No. 8,593,902.

(60) Provisional application No. 61/531,187, filed on Sep. 6, 2011.

(51) Int. Cl.
*G11C 8/16* (2006.01)

(52) U.S. Cl.
USPC .................. 365/233.13; 365/233.1; 365/149; 365/233.19

(58) Field of Classification Search
USPC ...................... 365/233.13, 233.1, 149, 233.19
See application file for complete search history.

(56) References Cited

U.S. PATENT DOCUMENTS

2005/0135434 A1*  6/2005  Choi et al. .................... 370/537
2012/0195141 A1    8/2012  Magee et al.

* cited by examiner

*Primary Examiner* — Vu Le
*Assistant Examiner* — Han Yang
(74) *Attorney, Agent, or Firm* — McClure, Qualey & Rodack, LLP

(57) ABSTRACT

A double data rate pseudo SRAM (DDR PSRAM) is provided. The DDR PSRAM includes a data receiver, a memory and an address decoder. The data receiver receives a first single data rate data from a controller via a common bus according to a clock. The address decoder decodes the first single data rate data to obtain an address of the memory. The data receiver stores the double data rate data into the address of the memory. The DDR PSRAM also includes a data transmitter and a data strobe generating unit. The data transmitter obtains data stored in the address of the memory and provides a double data rate data to the controller according to the obtained data, and the data strobe generating unit a data strobe signal to the controller and toggling the data strobe signal in response to the double data rate data.

15 Claims, 11 Drawing Sheets

DDR PSRAM AND DATA WRITING AND READING METHODS THEREOF

CROSS REFERENCE TO RELATED APPLICATIONS

This application is a Divisional of U.S. application Ser. No. 13/403,689, filed on Feb. 23, 2012, which is a Continuation-In-Part of U.S. application Ser. No. 13/311,352, filed on Dec. 5, 2011, which claims the benefit of Provisional Application No. 61/531,187, filed on Sep. 6, 2011.

BACKGROUND OF THE INVENTION

1. Field of the Invention

The invention relates to a pseudo SRAM (PSRAM), and more particularly to a controller and a memory device of a double data rate pseudo (DDR) PSRAM, and the protocol therebetween.

2. Description of the Related Art

In portable applications, such as handheld/wireless devices, the use of low power consuming memory is essential. A PSRAM device meets both low power consumption and high density requirements. A PSRAM, like a conventional dynamic random access memory (DRAM), contains dynamic memory cells but, in terms of interface and packaging, has the appearance of a static random access memory (SRAM).

A PSRAM may operate in a burst mode. The burst mode enhances the speed of storing and retrieving data. In the burst mode, specific functions must occur in a predetermined sequence. Such functions are generally performed in response to command signals provided by a controller of the PSRAM device. The timing of the command signals is determined according a clock signal and is aligned to an edge (rising or falling) of the clock signal or occurs after a predetermined time after the edge (rising or falling) of the clock signal. Furthermore, in the burst mode, the PSRAM device may operate in fixed and variable modes of wait states, wherein the wait state determines a minimal number of clock cycles that pass before a valid data is present on a data bus.

In a double data rate (DDR) SDRAM device, both the rising and falling edges of the clock signal are trigger points for read and write operations. Compared with a single data rate (SDR) SDRAM device, the DDR SDRAM device using the same clock frequency will double the data rate, and a differential clock scheme is used to conform to increased timing accuracy requirements.

BRIEF SUMMARY OF THE INVENTION

Double data rate pseudo SRAM (DDR PSRAM) and data writing and reading methods thereof are provided. An embodiment of a DDR PSRAM is provided. The DDR PSRAM comprises a data receiver, a memory and an address decoder. The data receiver receives a first single data rate data from a controller via a common bus according to a clock, and receives a double data rate data from the controller via the common bus according to a data strobe signal from the controller. The address decoder decodes the first single data rate data to obtain an address of the memory. The data receiver stores the double data rate data into the address of the memory.

Furthermore, an embodiment of a data writing method for a DDR PSRAM is provided. A first single data rate data from a controller is obtained via a common bus according to a clock. The first single data rate data is decoded to obtain an address of a memory within the DDR PSRAM. A double data rate data from the controller is obtained via the common bus according to a data strobe signal from the controller. The double data rate data is stored into the address of the memory.

Moreover, another embodiment of a DDR PSRAM is provided. The DDR PSRAM comprises a data receiver, a memory, an address decoder, a data transmitter and a data strobe generating unit. The data receiver receives a first single data rate data from a controller via a common bus according to a clock. The address decoder decodes the single data rate data to obtain an address of the memory. The data transmitter obtains data stored in the address of the memory and provides a double data rate data to the controller via the common bus according to the obtained data. The data strobe generating unit provides a data strobe signal to the controller and toggles the data strobe signal in response to the double data rate data. The controller receives the double data rate data according to the data strobe signal.

In addition, an embodiment of a data reading method for a DDR PSRAM is provided. A first single data rate data from a controller is obtained via a common bus according to a clock. The first single data rate data is decoded to obtain an address of a memory within the DDR PSRAM. Data stored in the address of the memory is obtained. A double data rate data is provided to the controller via the common bus in response to a data strobe signal according to the obtained data. The controller receives the double data rate data according to the data strobe signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
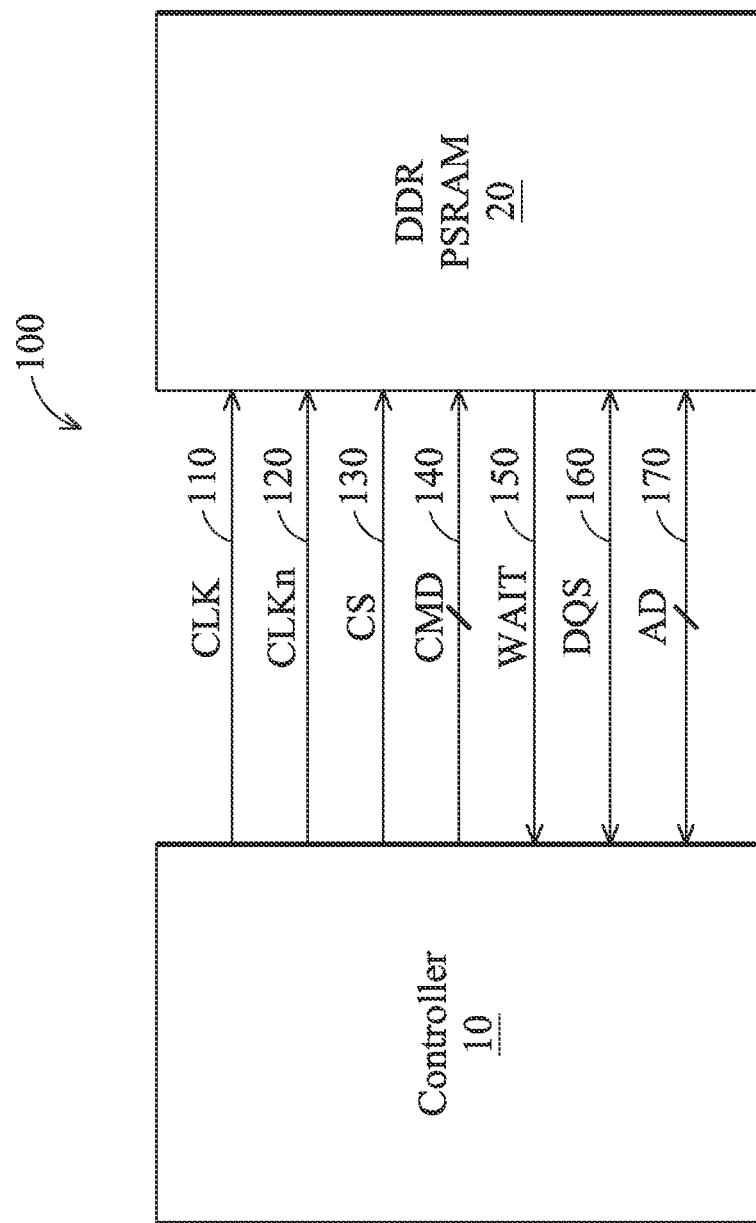
FIG. 1 shows an electronic device comprising a controller and a DDR PSRAM.

FIG. 1 shows an electronic device 100. The electronic device 100 comprises a controller 10 and a DDR PSRAM 20. Furthermore, the electronic device 100 further comprises a plurality of unidirectional transmission lines and a plurality of bi-directional transmission lines with tri-state between the controller 10 and the DDR PSRAM 20. Lines 110 and 120 are unidirectional transmission lines for providing a pair of differential clock signals CLK and CLKn from the controller 10 to the DDR PSRAM 20. Line 130 is a unidirectional line for providing a chip select signal CS from the controller 10 to the DDR PSRAM 20. The bus 140 comprises a plurality of unidirectional transmission lines for providing a command signal CMD from the controller 10 to the DDR PSRAM 20. The line 150 is a unidirectional line for providing a wait signal WAIT from the DDR PSRAM 20 to the controller 10, wherein the wait signal WAIT is used to notify the controller 10 when valid data with double data rate is present on the bus 130. Line 160 is a bi-directional transmission line for transferring a data strobe signal DQS between the controller 10 and the DDR PSRAM 20. Bus 170 is a common bus comprising a plurality of bi-directional transmission lines for transferring of an address/data signal AD, wherein the address/data signal AD comprising address and data streams with different transfer rates are multiplexed into the bus 170. Compared with a conventional DDR PSRAM device, the DDR PSRAM 20 is a low pin count (LPC) memory due to the sharing of the address streams and data streams on the bus 170.

Figure 2:
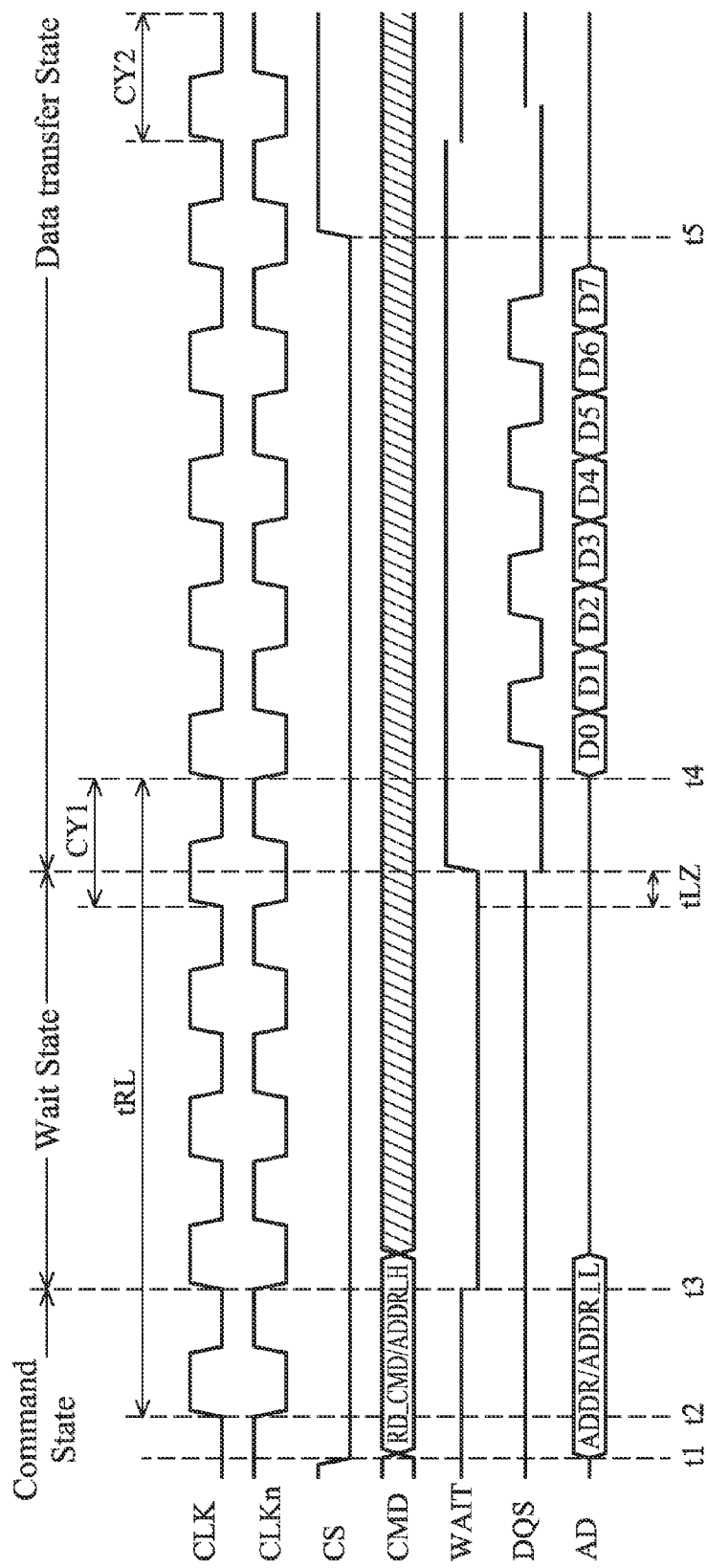
FIG. 2 shows a waveform illustrating the signals between the controller 10 and the DDR PSRAM of FIG. 1.

FIG. 2 shows a waveform illustrating the signals between the controller 10 and the DDR PSRAM of FIG. 1. Referring to FIG. 1 and FIG. 2 together, the controller 10 de-asserts the chip select signal CS to select the DDR PSRAM 20 at time t1, and then the controller 10 provides a read command RD_CMD to the DDR PSRAM 20 via the command signal CMD. At the same time, the controller 10 also provides an address ADDR to the DDR PSRAM 20 via the address/data signal AD. In one embodiment, the address ADDR may be divided into a high byte ADDR_H and a low byte ADDR_L, and the controller 10 provides the high byte ADDR_H via the command signal CMD and provides the low byte ADDR_L via the address/data signal AD. At time t2, the controller 10 provides the clock signals CLK and CLKn to the DDR PSRAM 20, so that the DDR PSRAM 20 can receive (may alternately refer to fetch) the command signal CMD and the address/data signal AD according to the clock signals CLK and CLKn in a command state. For example, in FIG. 2, the DDR PSRAM 20 receives the command signal CMD and the address/data signal AD in a rising edge of the clock signal CLK at time t2. When the read command RD_CMD is accepted by the DDR PSRAM 20 from the command signal CMD, the DDR PSRAM 20 de-asserts the wait signal WAIT at time t3, to notify the controller 10 to enter a wait state.

When the read command RD_CMD and the address ADDR are accepted, the DDR PSRAM 20 executes a read operation to obtain the data from a memory cell of the DDR PSRAM 20 according to the address ADDR. Before transmitting the obtained data to the controller 10, the DDR PSRAM 20 asserts the wait signal WAIT and de-asserts the data strobe signal DQS in a clock cycle CY1, which indicates that the obtained data is ready to be transmitted to the controller 10. In FIG. 2, the DDR PSRAM 20 is operating in a variable mode of the wait state, thus the time period tRL is variable in clock cycles (read latency) according to various specifications. At time t4, the DDR PSRAM 20 starts to provide the obtained data D0-D7 to the controller 10. Furthermore, the DDR PSRAM 20 may toggle the data strobe signal DQS in response to the data D0-D7. Thus, the controller 10 may sequentially receive the data D0-D7 according to both rising and falling edges of the data strobe signal DQS. After the data D0-D7 are received, the controller 10 asserts the chip select signal CS at time t5 to finish the read operation. Then, the wait signal WAIT and the data strobe signal DQS are both put into a high-impedance state in a clock cycle CY2.

In FIG. 2, the data strobe signal DQS is put into a high-impedance state until the wait state is finished. Furthermore, for the data strobe signal DQS, a time period tLZ is called as a low impendence time from a rising edge of the clock signal CLK in the clock cycle CY1. In general, the data strobe signal DQS is used to latch the data D0-D7, and a tracking circuit is used to track the data strobe signal DQS in a conventional controller. For example, when it is detected that the wait signal WAIT has been de-asserted (or asserted in another embodiment from different design specification), the conventional controller needs to mask the impendence period of the data strobe signal DQS, so as to gate the data strobe signal DQS. If the masked impendence period of the data strobe signal DQS is mistaken due to the variable time period tRL and the time period tLZ, it is hard to obtain the valid data D0-D7 according to the data strobe signal DQS. For example, if the wait signal WAIT or the data strobe signal DQS drifts in the clock cycle CY1, a transient of the wait signal WAIT may be later than the time period tLZ, i.e. the data strobe signal DQS is de-asserted earlier than the transient of the wait signal WAIT, thereby generating a time violation. Therefore, it is hard to mask the impendence period of the data strobe signal DQS for the conventional controller, thus causing invalid data latching.

Figure 3:
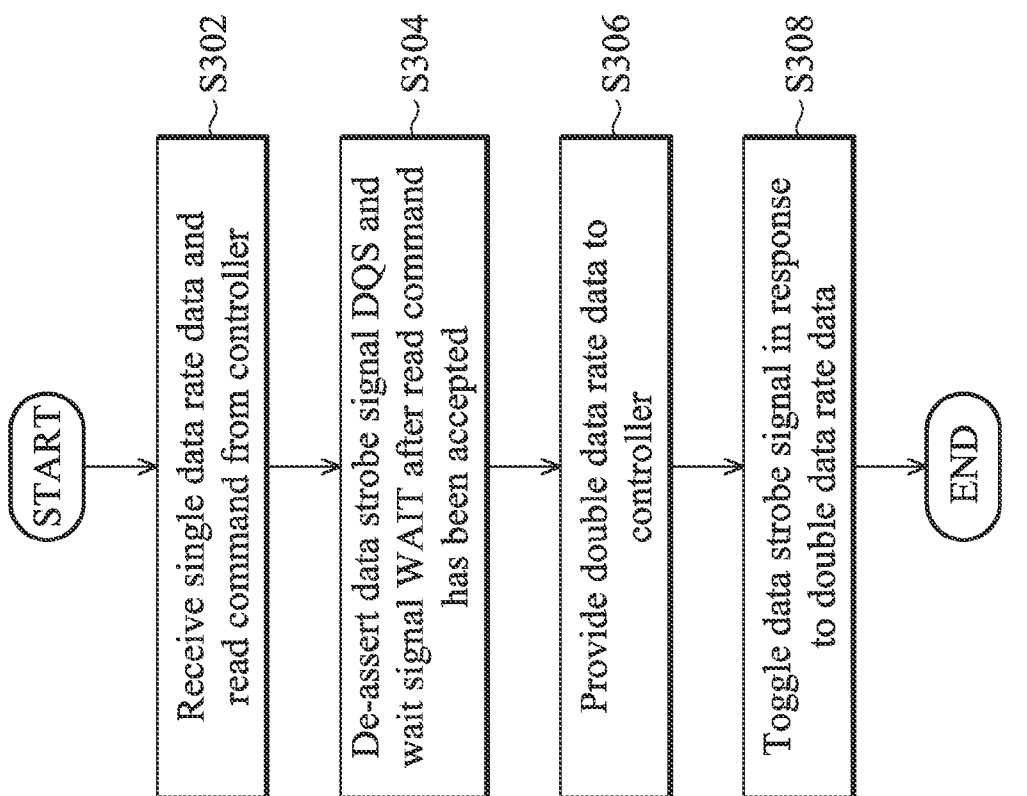
FIG. 3 shows an operating method for a low pin count DDR PSRAM (e.g. PSRAM of FIG. 1) according to an embodiment of the invention.
Figure 4:
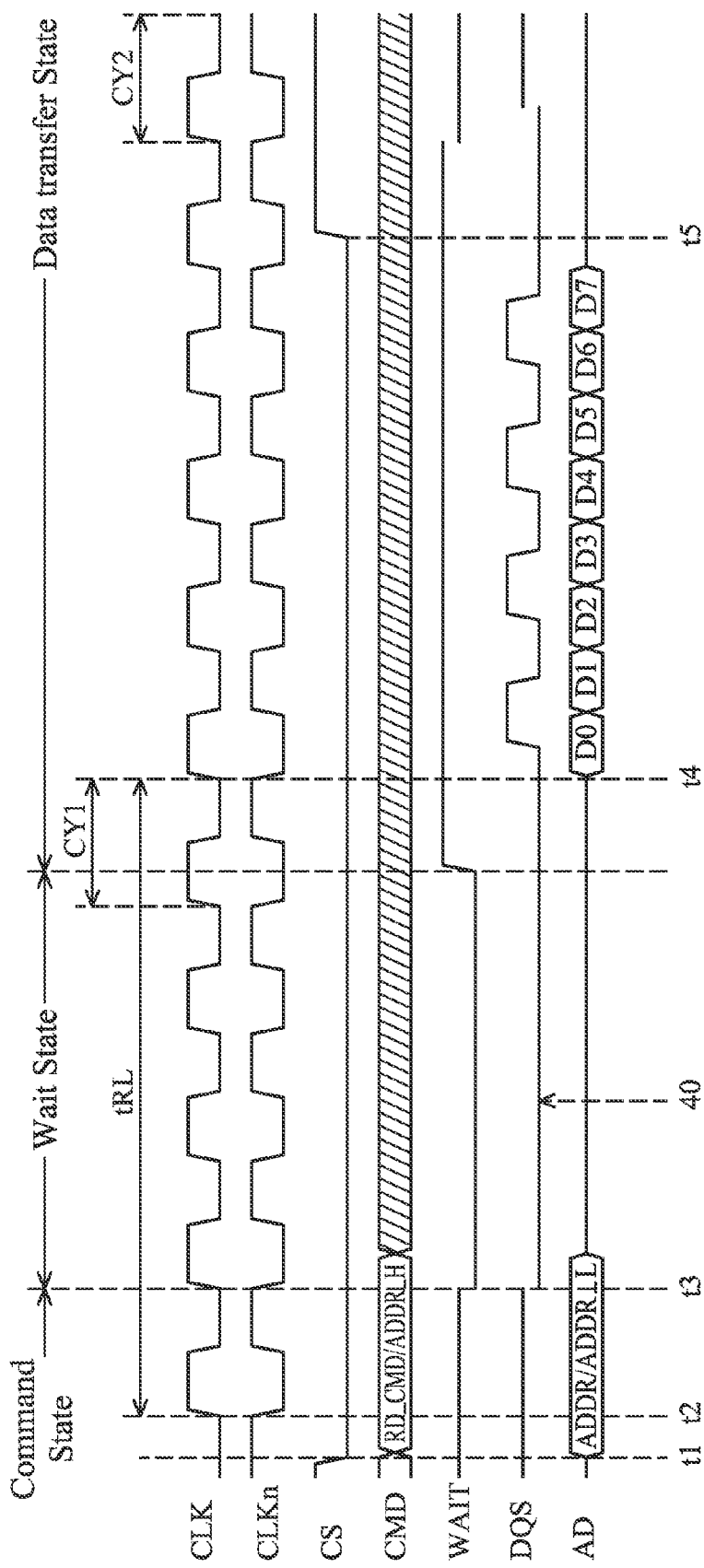
FIG. 4 shows a waveform illustrating the signals of FIG. 1 according to the operating method of FIG. 3.

FIG. 3 shows an operating method for a low pin count DDR PSRAM (e.g. PSRAM 20 of FIG. 1) according to an embodiment of the invention, and FIG. 4 shows a waveform illustrating the signals of FIG. 1 according to the operating method of FIG. 3. Referring to FIG. 3 and FIG. 4 together, in step S302, the DDR PSRAM receives a single data rate data from a controller via a common bus coupled between the DDR PSRAM and the controller, wherein the single data rate data comprises an address of the DDR PSRAM, as shown in a command state of FIG. 4. At the same time, the DDR PSRAM also receives a read command from the controller via a command signal. In step S304, after the read command from the controller has been accepted, the DDR PSRAM provides a data strobe signal DQS and a wait signal WAIT to the controller and de-asserts the data strobe signal DQS and the wait signal WAIT both, as shown in a wait state of FIG. 4. Next, the DDR PSRAM provides a double data rate data comprising data stored in the address of the DDR PSRAM to the controller via the common bus (step S306), and the DDR PSRAM toggles the data strobe signal in response to the transmitted double data (step S308). Compared to FIG. 2, the data strobe signal of FIG. 4 is de-asserted during the wait state, as shown in label 40, thus no time period tLZ of FIG. 2 exists. Therefore, the controller receives the double data rate data according to the data strobe signal DQS without masking the impendence period of the data strobe signal DQS. In other words, the controller can directly use both the rising and falling edges of the data strobe signal DQS to latch the double data rate data. Furthermore, the wait signal and the data strobe signal are assigned to a high-impedance until the read command from the controller is received by the DDR PSRAM, i.e. the wait signal and the data strobe signal are assigned to a high-impedance in the command state. In addition, after the data D0-D7 are received by the DDR PSRAM, the controller 10 asserts the chip select signal CS to finish the read operation, and then the wait signal WAIT and the data strobe signal DQS are both put into a high-impedance state.

Figure 5:
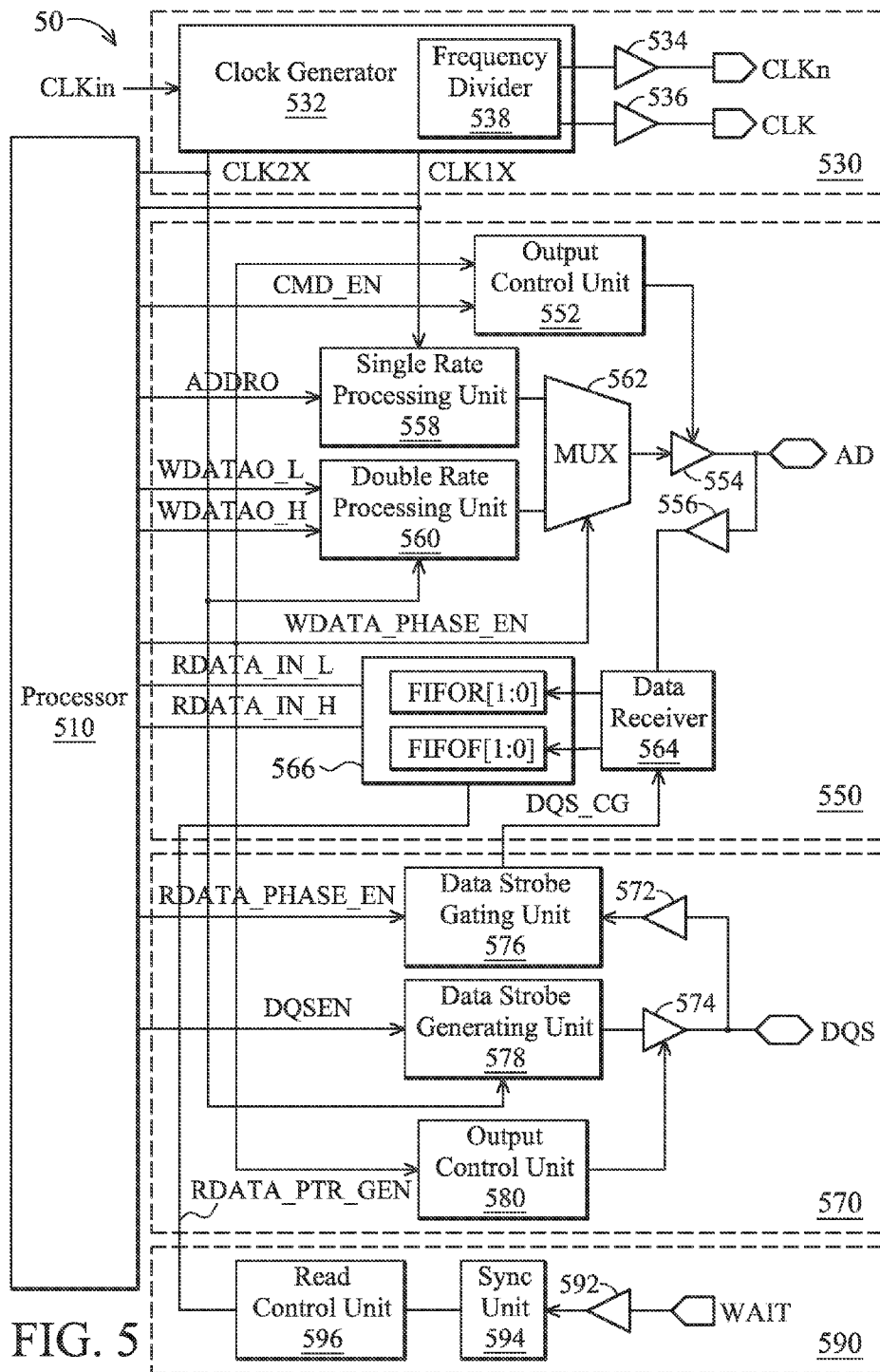
FIG. 5 shows a controller for a low pin count DDR PSRAM (e.g. PSRAM of FIG. 1) according to an embodiment of the invention.

FIG. 5 shows a controller 50 for a low pin count DDR PSRAM (e.g. PSRAM 20 of FIG. 1) according to an embodiment of the invention. The controller 50 comprises a processor 510, a clock module 530, an address/data module 550, a data strobe module 570 and a wait module 590. The processor 510 controls the clock module 530 to provide the differential clock signals CLK and CLKn to the DDR PSRAM. The clock module 530 comprises a clock generator 532 and two output buffers 534 and 536, wherein the clock generator 532 comprises a frequency divider 538. The clock generator 532 generates the clock signals CLK1X and CLK2X according to an input clock CLKin, wherein the clock signal CLK2X is two times the frequency of the clock signal CLK1X. In one embodiment, the input clock CLKin is provided by an oscillator. Furthermore, the frequency divider 538 divides the clock signal CLK2X to generate the CLK1X clock signal. The differential clock signals CLK and CLKn are generated from the CLK1X clock signal, and have the same frequency as that of the clock signal CLK1X. Moreover, the differential clock signals CLK and CLKn are provided to the DDR PSRAM via the output buffers 536 and 534, respectively. The processor 510 controls the address/data module 550 to provide address streams to the DDR PSRAM in a command phase, provide data streams to the DDR PSRAM in a write data phase, and receive data streams from the DDR PSRAM in a read data phase. The address/data module 550 comprises an output control unit 552, an output buffer 554, an input buffer 556, a single rate processing unit 558, a double rate processing unit 560, a selector 562, a data receiver 564 and a storage unit 566. The selector 562 is used to selectively provide any of the output of the single rate processing unit 558 and the double rate processing unit 560 to the output buffer 554 according to a control signal WDATA_PHASE_EN. In the embodiment, the selector 562 is a multiplexer (MUX). The processor 510 controls the data strobe module 570 to provide a data strobe signal to the DDR PSRAM in the write data phase and receive a data strobe signal from the DDR PSRAM in the read data phase. The data strobe module 570 comprises an input buffer 572, an output buffer 574, a data strobe gating unit 576, a data strobe generating unit 578 and an output control unit 580. The processor 510 controls the wait module 590 to receive a wait signal from the DDR PSRAM in the read data phase. The wait module 590 comprises an input buffer 592, a synchronization unit 594 and a read control unit 596. Details of descriptions illustrating the operations of the address/data module 550, the data strobe module 570 and the wait module 590 are described below.

Figure 6:
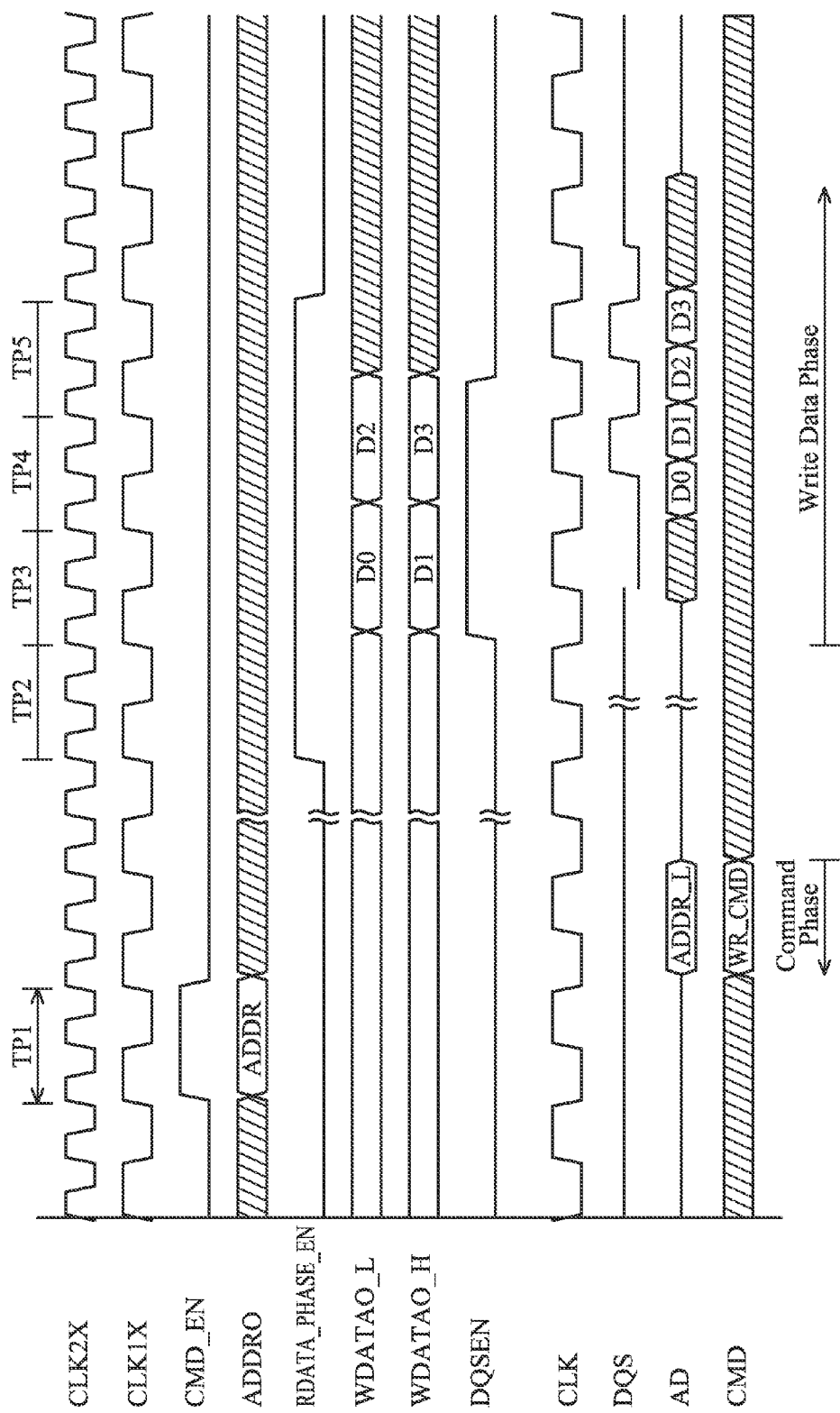
FIG. 6 shows a waveform illustrating the signals of the controller of FIG. 5 according to an embodiment of the invention, wherein the controller performs a synchronous write operation with 4 bursts for a low pin count DDR PSRAM (e.g. PSRAM of FIG. 1)

FIG. 6 shows a waveform illustrating the signals of the controller 50 of FIG. 5 according to an embodiment of the invention, wherein the controller 50 performs a synchronous write operation with 4 bursts for a low pin count DDR PSRAM (e.g. PSRAM 20 of FIG. 1). Referring to FIG. 5 and FIG. 6 together, during a time period TP1, the processor 510 provides an enable signal CMD_EN with a logic level HIGH to the output control unit 552, so as to control the output control unit 552 to enable the output buffer 554. At the same time, the processor 510 also provides a signal ADDRO with address information ADDR to the single rate processing unit 558. Next, the single rate processing unit 558 obtains a single data rate data with the address information ADDR according to the clock signal CLK1X and provides the single data rate data to the selector 562. Furthermore, the processor 510 provides a control signal WDATA_PHASE_EN with a logic level LOW to the selector 562, so as to control the selector 562 to output the single data rate data provided by the single rate processing unit 558, to the output buffer 554. Thus, an address/data signal AD with address information ADDR is provided to the DDR PSRAM in a command phase. In the meantime, a command signal CMD with a write command WR_CMD is sent to the DDR PSRAM via a command bus (e.g. 140 of FIG. 1). Next, from a time period TP2 to a time period TP5, the processor 510 provides the control signal WDATA_PHASE_EN with a logic level HIGH to the output control units 552 and 580, so as to control the output control units 552 and 580 to enable the output buffers 554 and 574. According to fixed write latency (such as N cycles), the processor 510 provides the control signal WDATA_PHASE_EN with a logic level HIGH upon the N clock cycle of the clock signal CLK1X after sending the write command, so as to enter the write data phase. Furthermore, the processor 510 provides the control signal WDATA_PHASE_EN to the selector 562, so as to provide an output of the double rate processing unit 560 to the output buffer 554. The processor 510 provides the signal WDATAO_L with a data D0 and the signal WDATAO_H with a data D1 to the double rate processing unit 560 during the time period TP3, and the processor 510 provides the signal WDATAO_L with a data D2 and the signal WDATAO_H with a data D3 to the double rate processing unit 560 during the time period TP4. The double rate processing unit 560 provides a double data rate data with the data D0, D1, D2 and D3 to the output buffer 554 via the selector 562 according to the clock signal CLK2X. Thus, an address/data signal AD with the data D0, D1, D2 and D3 is provided to the DDR PSRAM in the write data phase. In the embodiment, the double rate processing unit 560 alternately provides the data of the signals WDATAO_L and WDATAO_H as the double data rate data according to the clock signal CLK2X. Therefore, the address/data signal AD with data streams formed by the data D0-D3 can be transmitted to the DDR PSRAM in sequence. Moreover, during the time periods TP3 and TP4, the processor 510 provides an enable signal DQSEN with a logic level HIGH to the data strobe generating unit 578, so as to control the data strobe generating unit 578 to provide a data strobe signal DQS to the DDR PSRAM via the output buffer 574. Thus, the DDR PSRAM can receive the address/data signal AD according to both rising and falling edges of the data strobe signal DQS, and then the DDR PSRAM writes the data D0, D1, D2 and D3 into memory cells thereof according to the address information ADDR.

Figure 7:
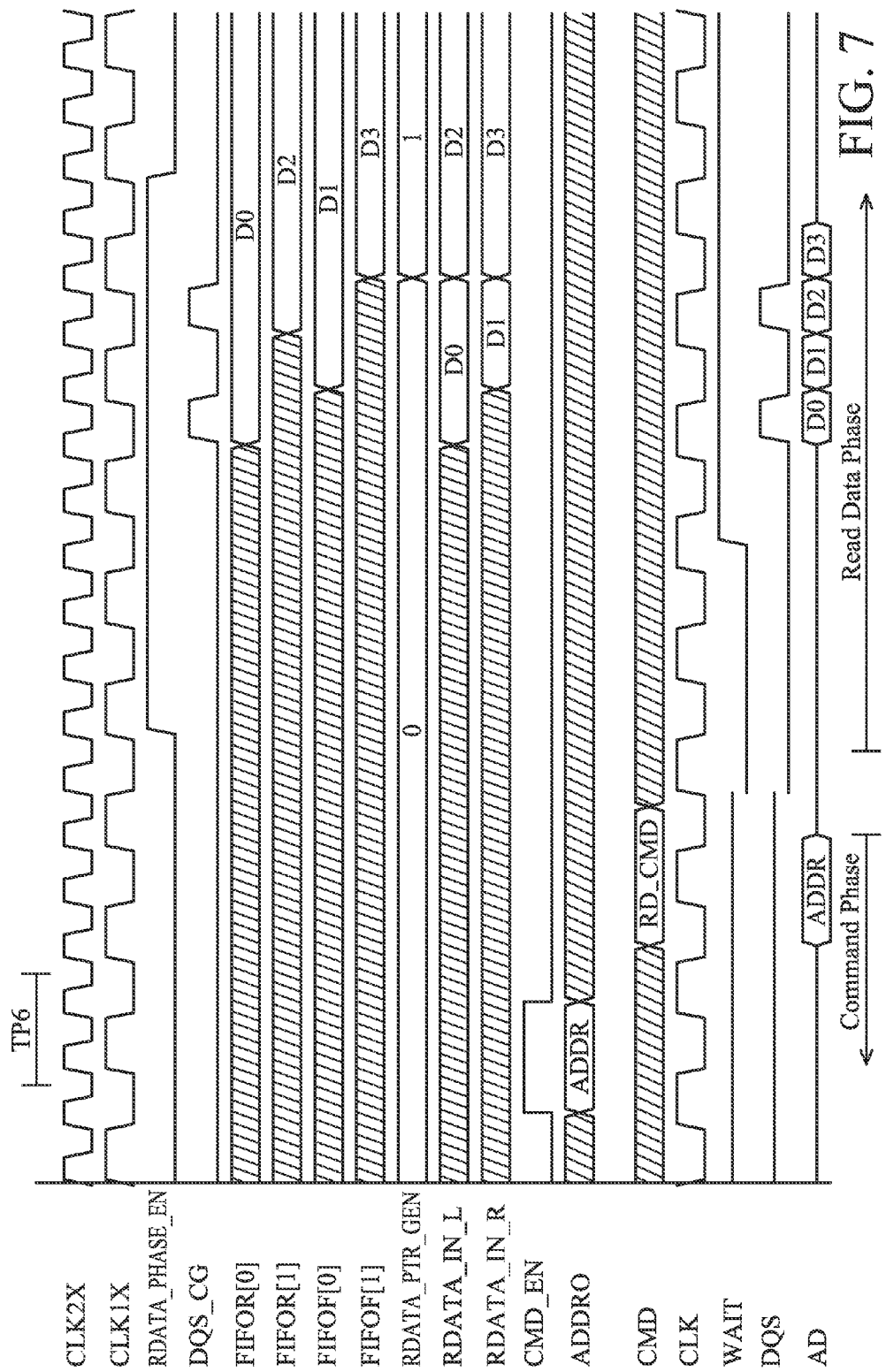
FIG. 7 shows a waveform illustrating the signals of the controller of FIG. 5 according to an embodiment of the invention, wherein the controller performs a synchronous read operation with 4 bursts for a low pin count DDR PSRAM (e.g. PSRAM of FIG. 1)

FIG. 7 shows a waveform illustrating the signals of the controller 50 of FIG. 5 according to an embodiment of the invention, wherein the controller 50 performs a synchronous read operation with 4 bursts for a low pin count DDR PSRAM (e.g. PSRAM 20 of FIG. 1). Referring to FIG. 5 and FIG. 7 together, during a time period TP6, the processor 510 provides an enable signal CMD_EN with a logic level HIGH to the output control unit 552, so as to control the output control unit 552 to enable the output buffer 554. At the same time, the processor 510 also provides a signal ADDRO with address information ADDR to the single rate processing unit 558. Next, the single rate processing unit 558 obtains a single data rate data with the address information ADDR according to the clock signal CLK1X and provides the single data rate data to the selector 562. Furthermore, the processor 510 provides a control signal WDATA_PHASE_EN with a logic level LOW to the selector 562, so as to control the selector 562 to output the single data rate data provided by the single rate processing unit 558, to the output buffer 554. Thus, an address/data signal AD with address information ADDR is provided to the DDR PSRAM in a command phase. In the meantime, a command signal CMD with a read command RD_CMD is sent to the DDR PSRAM via a command bus (e.g. 140 of FIG. 1). As described in the operating method of FIG. 3, after the read command RD_CMD of the command signal CMD from the controller is accepted, the DDR PSRAM provides a data strobe signal DQS and a wait signal WAIT to the controller and de-asserts the data strobe signal and the wait signal both in a wait state. In the wait module 590, the input buffer 592 transmits the wait signal WAIT from the DDR PSRAM to the synchronization unit 594 for synchronization, and the synchronization unit 594 provides a synchronized wait signal to the read control unit 596. Furthermore, the processor 510 provides the enable signal RDATA_PHASE_EN with a logic level HIGH upon 2 clock cycles after sending the read command RD_CMD, so as to enter a read data phase. Furthermore, the read control unit 596 provides a ready signal RDATA_PTR_GEN to the storage unit 566. In a read data phase, the data strobe gating unit 576 is enabled by the enable signal RDATA_PHASE_EN, to gate the data strobe signal DQS toggled by the DDR PSRAM, so as to obtain a gated signal DQS_CG and provide the gated signal DQS_CG to the read receiver 564. The read receiver 564 receives the address/data signal AD from the DDR PSRAM and stores the data of the address/data signal AD into first in first out units (FIFOs) of the storage unit 566 according to the gated signal DQS_CG, wherein the address/data signal AD comprises data streams formed by the data units D0, D1, D2 and D3 that are stored in the memory cells of the DDR PSRAM corresponding to the address information ADDR. For example, a first rising edge of the gated signal DQS_CG is used to latch the data D0 into the FIFO FIFOR[0], a first falling edge of the gated signal DQS_CG is used to latch the data D1 into the FIFO FIFOF[0], a second rising edge of the gated signal DQS_CG is used to latch the data D2 into the FIFO FIFOR[1], and a second falling edge of the gated signal DQS_CG is used to latch the data D3 into the FIFO FIFOF[1]. In other embodiments, the storage unit 566 may comprises the register or other storage cells to store the data of the address/data signal AD. Furthermore, the storage unit 566 provides the data units stored in the FIFOR[1:0] and FIFOF[1:0] to the processor 510 via the signals RDATA_IN_R and RDATA_IN_L according to the ready signal RDATA_PTR_GEN. Thus, the processor 510 obtains the data D0, D1, D2 and D3 corresponding to the address information ADDR. After the data D0, D1, D2 and D3 are stored by the processor 510, the processor 510 de-asserts the enable signal RDATA_PHASE_EN, to finish the read data phase.

Figure 8:
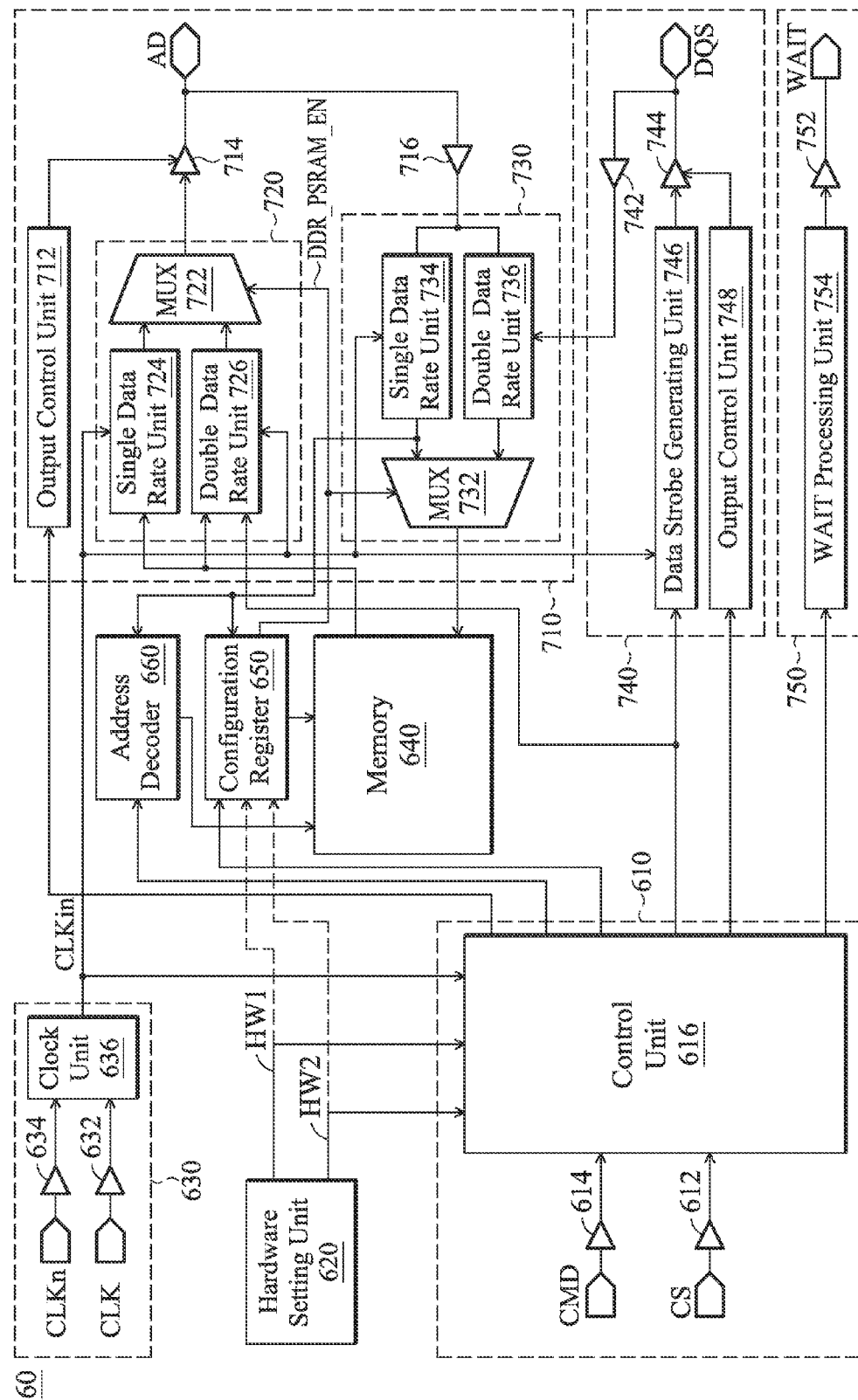
FIG. 8 shows a low pin count DDR PSRAM according to an embodiment of the invention.

FIG. 8 shows a low pin count DDR PSRAM 60 according to an embodiment of the invention. The DDR PSRAM 60 comprises a control module 610, a hardware setting unit 620, a clock module 630, a memory 640, a configuration register 650, an address decoder 660, an address/data module 710, a data strobe module 740 and a wait module 750. The control module 610 comprises a control unit 616, an input buffer 614 for receiving a command signal CMD from a controller (e.g. 10 of FIG. 1) and an input buffer for receiving a chip select signal CS from the controller. The hardware setting unit 620 provides two control signals HW1 and HW2 to the control unit 616 or the configuration register 650, wherein the control signals HW1 and HW2 are determined according to a hardware configuration of the DDR PSRAM 60 that is set by pin strap or EFUSE. In the embodiment, the hardware setting unit 620 provides the control signal HW1 to the control unit 616 for indicating that the DDR PSRAM 60 is operated in a single data rate mode or a double data rate mode, and the hardware setting unit 620 provides the control signal HW2 to the control unit 616 for indicating whether to de-assert the data strobe signal DQS during a wait state, as described in FIGS. 3-4. The clock module 630 comprises a clock unit 636, an input buffer 632 for receiving a clock signal CLK from the controller and an input buffer 634 for receiving a clock signal CLKn from the controller. The memory 640 comprises a plurality of memory cells for storing data. The address/data module 710 comprises an output control unit 712, an output buffer 714, an input buffer 716, a data transmitter 720 and a data receiver 730. The control unit 616 can control the output control unit 712 to enable the output buffer 714 for outputting the address/data signal AD. In the address/data module 710, the data transmitter 720 provides data streams to the controller in a read data phase. The data transmitter 720 comprises a selector 722, a single data rate unit 724 for single data rate data and a double data rate unit 726 for double data rate data. The selector 722 is used to selectively provide the output of the single data rate unit 724 and the double data rate unit 726 to the controller via the output buffer 714 according to a control signal DDR_PSRAM_EN provided by the configuration register 650, wherein the control signal DDR_PSRAM_EN is used to indicate that the DDR PSRAM 60 is operated in a single data rate mode or a double data rate mode. In the embodiment, the control signal DDR_PSRAM_EN is determined according to a command from the controller via the command signal CS or a hardware configuration of the hardware setting unit 620. In the address/data module 710, the data receiver 730 receives address streams from the controller in a command phase and receives data streams from the controller in a write data phase. The data receiver 730 comprises a selector 732, a single data rate unit 734 for single data rate data and a double data rate unit 736 for double data rate data. The selector 732 is used to selectively provide the output of the single data rate unit 734 and the double data rate unit 736 to the memory 640 according to the control signal DDR_PSRAM_EN from the configuration register 650. In the embodiment, the selectors 722 and 732 are multiplexers (MUXs). The control unit 616 controls the data strobe module 740 to provide the data strobe signal DQS to the controller in the read data phase and to receive the data strobe signal DQS from the controller in the write data phase. The data strobe module 740 comprises an input buffer 742, an output buffer 744, a data strobe generating unit 746 and an output control unit 748. The control unit 616 can control the output control unit 748 to enable the output buffer 744 for outputting the data strobe signal DQS. The control unit 616 can control the data strobe generating unit 746 to toggle the data strobe signal DQS in response to a double data rate data of the address/data signal AD. Furthermore, the control unit 616 controls the wait module 750 to provide a wait signal to the DDR PSRAM in the read data phase. The wait module 750 comprises an output buffer 752 and a wait processing unit 754. Details of descriptions illustrating the operations of the address/data module 710, the data strobe module 740 and the wait module 750 are described below.

Figure 9:
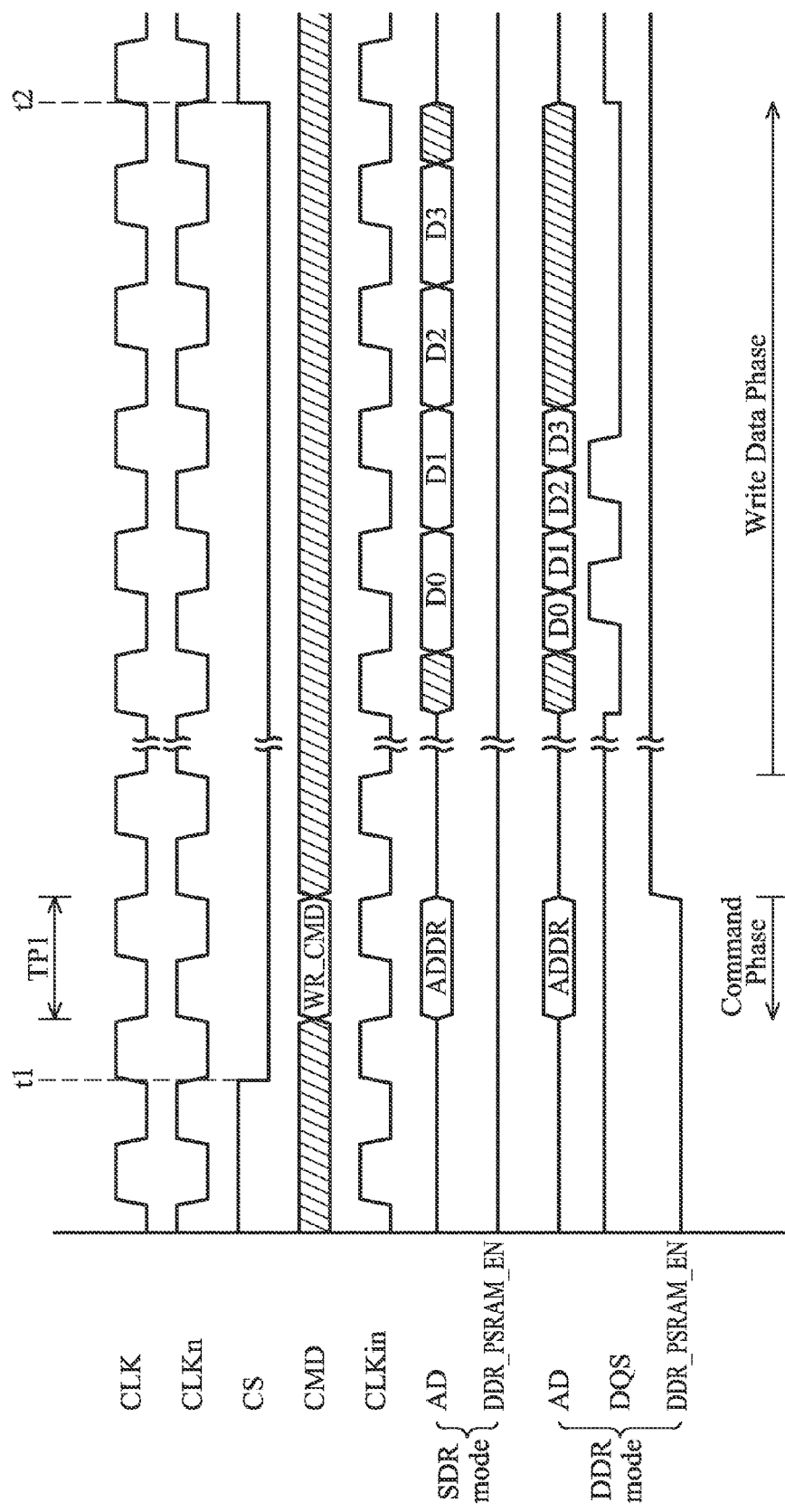
FIG. 9 shows a waveform illustrating the signals of the DDR PSRAM of FIG. 8 according to an embodiment of the invention, wherein a controller performs a synchronous write operation with 4 bursts for the low pin count DDR PSRAM.

FIG. 9 shows a waveform illustrating the signals of the DDR PSRAM 60 of FIG. 8 according to an embodiment of the invention, wherein a controller (e.g. 10 of FIG. 1) performs a synchronous write operation with 4 bursts for the low pin count DDR PSRAM 60. Referring to FIG. 8 and FIG. 9 together, first, in the clock module 630, the clock unit 636 receives the clock signals CLK and CLKn from the controller to generate a clock signal CLKin, wherein the clock signal CLKin has the same frequency as that of the clock signals CLK and CLKn. In one embodiment, the clock unit 636 may generate the clock signal CLKin only according to the clock signal CLK or CLKn when the DDR PSRAM 60 is operated in a single data rate (SDR) mode, for example, the clock unit 636 may configure the clock signal CLK as the lock signal CLKin. Next, at time t1, the chip select signal CS is de-asserted by the controller, to notify the DDR PSRAM 60 for data access. Next, during a time period TP1, the control unit 616 receives a command signal CMD with a write command WR_CMD from the controller. Simultaneously, the control unit 616 controls the configuration register 650, the address decoder 660 and the address/data module 710 to receive an address/data signal AD with address information ADDR provided by the controller in a command phase. In the data receiver 730, the single data rate unit 734 receives the address/data signal AD to obtain the address information ADDR and provides the address information ADDR to the configuration register 650 and the address decoder 660. Next, the address decoder 660 decodes the address information ADDR to obtain an address of the memory 640 corresponding to the address information ADDR, and the configuration register 650 configures the memory 640 according to the address information ADDR. In the embodiment, the command signal CMD and the address/data signal AD are latched by the DDR PSRAM 60 in response to a rising edge of the clock CLKin. According to fixed write latency (such as N cycles), the controller may enter a write data phase upon the N clock cycle of the clock signal CLK after sending the write command. Next, the address/data signal AD with the data D0, D1, D2 and D3 written by the controller is received by the data receiver 730 in the write data phase. If the control signal DDR_PSRAM_EN indicates that the DDR PSRAM 60 is operated in a SDR mode, for example, the control signal DDR_PSRAM_EN is at a low logic level, the single data rate unit 734 receives the address/data signal AD in response to the clock CLKin to obtain the data D0, D1, D2 and D3, and then the control signal DDR_PSRAM_EN controls the selector 732 to pass the data D0, D1, D2 and D3 to the memory 640 from the single data rate unit 734. Thus, the data D0, D1, D2 and D3 are stored into the address of the memory 640 corresponding to the address information ADDR. Next, at time t2, the controller asserts the chip select signal CS to complete the synchronous write operation. If the control signal DDR_PSRAM_EN indicates that the DDR PSRAM 60 is operated in a double data rate (DDR) mode, for example, the control signal DDR_PSRAM_EN is set to a high logic level according to a command from the controller via the command signal CMD, the double data rate unit 734 receives the address/data signal AD in response to the data strobe signal DQS to obtain the data D0, D1, D2 and D3, wherein the data strobe signal DQS from the controller is received by the input buffer 742. In other words, the data strobe module 740 is operated in an input mode. Furthermore, the double data rate unit 734 can receive the address/data signal AD according to both rising and falling edges of the data strobe signal DQS when the DDR PSRAM 60 is operated in the double data rate mode. Next, the control signal DDR_PSRAM_EN controls the selector 732 to pass the data D0, D1, D2 and D3 to the memory 640 from the double data rate unit 736. Thus, the data D0, D1, D2 and D3 are stored in the address of the memory 640 corresponding to the address information ADDR.

Figure 10:
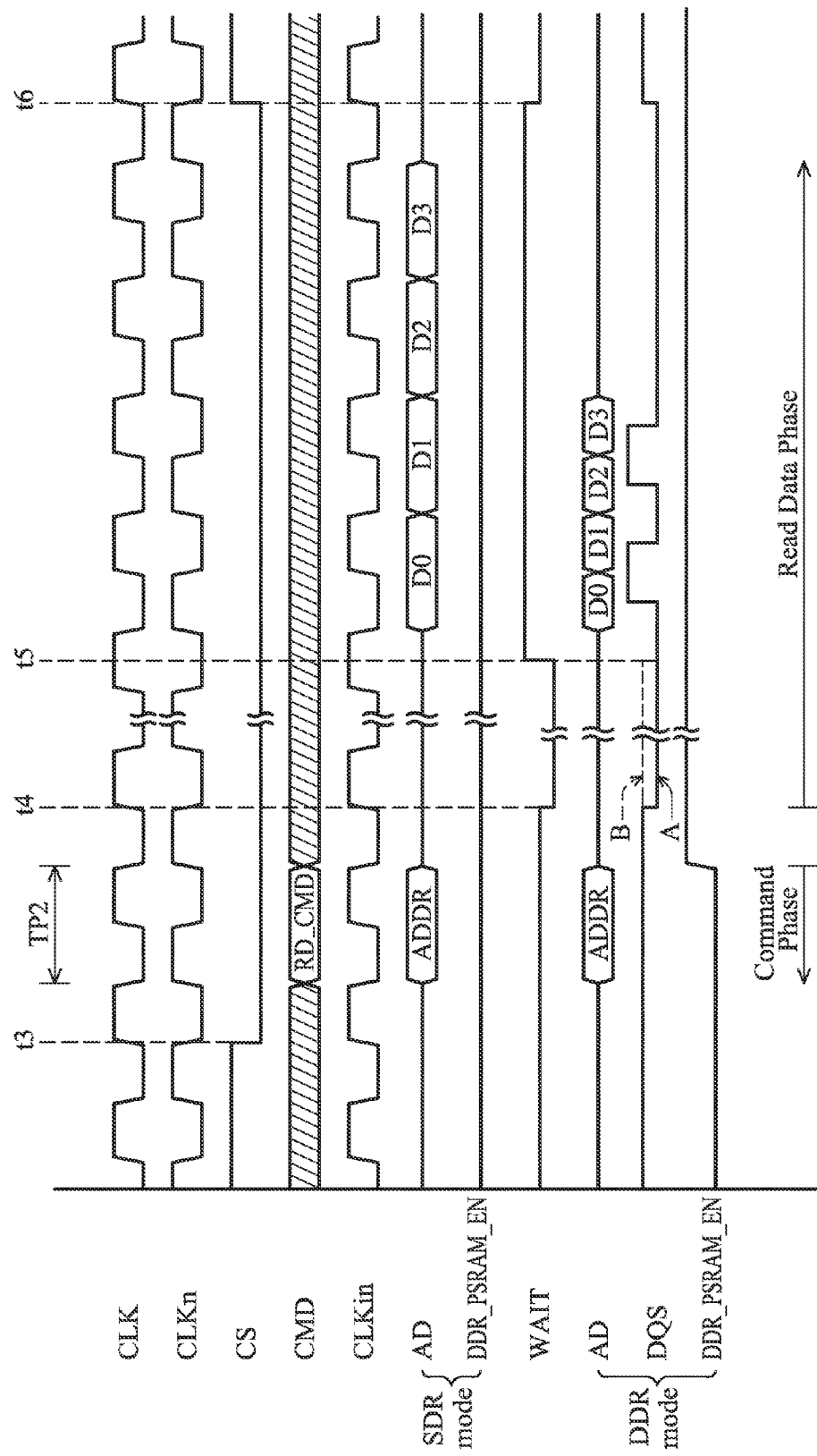
FIG. 10 shows a waveform illustrating the signals of the DDR PSRAM of FIG. 8 according to an embodiment of the invention, wherein a controller performs a synchronous read operation with 4 bursts for the low pin count DDR PSRAM.

FIG. 10 shows a waveform illustrating the signals of the DDR PSRAM 60 of FIG. 8 according to an embodiment of the invention, wherein a controller (e.g. 10 of FIG. 1) performs a synchronous read operation with 4 bursts for the low pin count DDR PSRAM 60. Referring to FIG. 8 and FIG. 10 together, first, in the clock module 630, the clock unit 636 receives the clock signals CLK and CLKn from the controller to generate a clock signal CLKin, wherein the clock signal CLKin has the same frequency as that of the clock signals CLK and CLKn. Next, at time t3, the chip select signal CS is de-asserted by the controller, to notify the DDR PSRAM 60 for data access. Next, during a time period TP2, the control unit 616 receives a command signal CMD with a read command RD_CMD from the controller. Simultaneously, the control unit 616 controls the configuration register 650, the address decoder 660 and the address/data module 710 to receive an address/data signal AD with address information ADDR provided by the controller in a command phase. In the data receiver 730, the single data rate unit 734 receives the address/data signal AD to obtain the address information ADDR and provides the address information ADDR to the configuration register 650 and the address decoder 660. Next, the address decoder 660 decodes the address information ADDR to obtain an address of the memory 640 corresponding to the address information ADDR, and the configuration register 650 configures the memory 640 according to the address information ADDR. In the embodiment, the command signal CMD and the address/data signal AD are latched by the DDR PSRAM 60 in response to a rising edge of the clock CLKin. Furthermore, when the read command RD_CMD is accepted by the control unit 616 from the command signal CMD, the control unit 616 controls the WAIT processing unit 754 to de-assert the wait signal WAIT at time t4, to notify the controller to enter a wait state. In FIG. 10, the DDR PSRAM 60 is operated in a variable mode of wait state. Next, the control unit 616 controls the WAIT processing unit 754 to assert the wait signal WAIT at time t5, for notifying the controller to receive the data stored in the address of the memory 640 corresponding to the address information ADDR in a read data phase, i.e. the double data rate data is ready to be transmitted to the controller. If the control signal DDR_PSRAM_EN indicates that the DDR PSRAM 60 is operated in a single data rate (SDR) mode, for example, the control signal DDR_PSRAM_EN is at a low logic level, the single data rate unit 724 of the data transmitter 720 obtains the data D0, D1, D2 and D3 stored in the memory 640, and transmits the address/data signal AD with the data D0, D1, D2 and D3 to the selector 722 in response to the clock CLKin, and then the control signal DDR_PSRAM_EN controls the selector 722 to transmit the data D0, D1, D2 and D3 from the single data rate unit 724 to the controller. Thus, the data D0, D1, D2 and D3 stored in the address of the memory 640 corresponding to the address information ADDR is received by the controller according to the clock signals CLK and CLKn. Next, at time t6, the controller asserts the chip select signal CS to complete the synchronous read operation.

Figure 11:
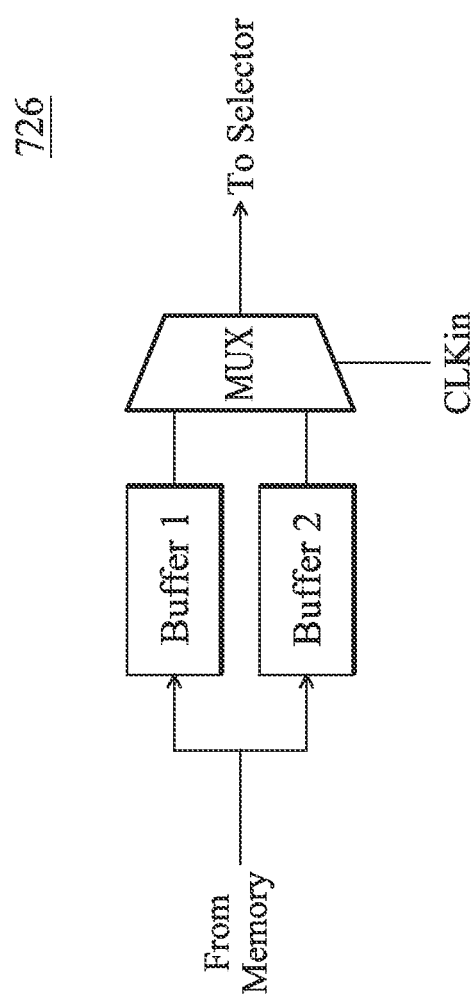
FIG. 11 shows a double data rate unit of a data transmitter of a low pin count DDR PSRAM according to an embodiment of the invention.

In FIG. 10, if the control signal DDR_PSRAM_EN indicates that the DDR PSRAM 60 is operated in a double data rate (DDR) mode, for example, the control signal DDR_PSRAM_EN is set to a high logic level according to a command from the controller via the command signal CMD, the double data rate unit 726 of the data transmitter 720 obtains the data D0, D1, D2 and D3 stored in the memory 640, and transmits the address/data signal AD with the data D0, D1, D2 and D3 to the selector 722 in response to the clock CLKin, and then the control signal DDR_PSRAM_EN controls the selector 722 to transmit the data D0, D1, D2 and D3 from the double data rate unit 726 to the controller in response to the data strobe signal DQS provided by the data strobe module 740. In the double data rate unit 726, the clock signal CLKin is used to provide the data D0, D1, D2 and D3 as the double data rate data. For example, the clock signal CLKin can control a multiplexer to alternately provide the data stored in two buffers as the address/data signal AD with the data D0, D1, D2 and D3, as shown in FIG. 11. Furthermore, in one embodiment, the double data rate unit 726 obtains the data D0, D1, D2 and D3 and transmits the address/data signal AD with the data D0, D1, D2 and D3 to the selector 722 according to the FIFO operations similar to the storage unit 566 described in FIG. 5. Specifically, the double data rate unit 726 alternately provides the data from the memory 640 as the double data rate data according to the data strobe signal. Therefore, the controller can receive the address/data signal AD according to both rising and falling edges of the data strobe signal DQS when the DDR PSRAM 60 is operated in the double data rate mode, to obtain the data D0, D1, D2 and D3. Furthermore, the control unit 616 can selectively control the data strobe module 740 to de-assert the data strobe signal DQS during a wait state. For example, if the control signal HW2 indicates that the data strobe signal DQS needs to be de-asserted during a wait state, the DDR PSRAM 60 may provide the data strobe signal DQS and the wait signal WAIT to the controller and de-assert the data strobe signal and the wait signal both in the wait state after the read command RD_CMD of the command signal CMD from the controller is accepted, as shown in an arrowhead A. Otherwise, the DDR PSRAM 60 may only provide the wait signal WAIT to the controller and de-assert the wait signal in the wait state after the read command RD_CMD of the command signal CMD from the controller is accepted. After the wait signal WAIT is asserted, the DDR PSRAM 60 provides the data strobe signal DQS to the controller, as shown in an arrowhead B.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A double data rate pseudo SRAM (DDR PSRAM), comprising:
    a data receiver, receiving a first single data rate data from a controller via a common bus according to a clock;
    a memory;
    an address decoder, decoding the single data rate data to obtain an address of the memory;
    a data transmitter, obtaining data stored in the address of the memory and providing a double data rate data to the controller via the common bus according to the obtained data; and
    a data strobe generating unit, providing a data strobe signal to the controller and toggling the data strobe signal in response to the double data rate data, thereby enabling the controller to receive the double data rate data according to the data strobe signal.

2. The DDR PSRAM as claimed in claim 1, wherein the first single data rate data is received in a command phase, and the double data rate data is transmitted in a read data phase.

3. The DDR PSRAM as claimed in claim 1, wherein the data stored in the address of the memory comprises a plurality of data units that are divided into a first group and a second group, and the data transmitter alternately provides the data units of the first and second groups as the double data rate data according to the data strobe signal, thereby enabling the controller to receive the data units of the first group in response to a rising edge of the data strobe signal and receive the data units of the second group in response to a falling edge of the data strobe signal.

4. The DDR PSRAM as claimed in claim 1, wherein the data transmitter provides a second single data rate data or the double data rate data to the controller via the common bus in a read data phase according to a control signal.

5. The DDR PSRAM as claimed in claim 4, wherein the data transmitter comprises:
    a single data rate unit, providing the second single data rate data to the controller in response to the clock according to the obtained data in the read data phase when the control signal indicates that the DDR PSRAM is operated in a single data rate mode; and
    a double data rate unit, providing the double data rate data to the controller in response to the data strobe signal according to the obtained data in the read data phase when the control signal indicates that the DDR PSRAM is operated in a double data rate mode,
    wherein the controller receives the second single data rate data according to the clock.

6. The DDR PSRAM as claimed in claim 5, wherein the control signal is determined according to a command from the controller or a hardware configuration of the DDR PSRAM.

7. The DDR PSRAM as claimed in claim 1, further comprising:
    a wait processing unit, providing a wait signal to the controller, de-asserting the wait signal after a read command from the controller has been accepted, and asserting the wait signal when the double data rate data is ready to be transmitted to the controller,
    wherein the wait signal is assigned to a high-impedance until the read command from the controller is accepted.

8. The DDR PSRAM as claimed in claim 7, wherein the data strobe signal is assigned to a high-impedance until the read command from the controller is accepted, and the data strobe generating unit provides the data strobe signal to the controller after the read command from the controller is accepted or after the wait signal is asserted according to a control signal.

9. The DDR PSRAM as claimed in claim 8, wherein the control signal is determined according to a command from the controller or a hardware configuration of the DDR PSRAM.

10. A data reading method for a double data rate pseudo SRAM (DDR PSRAM), comprising:
    obtaining a first single data rate data from a controller via a common bus according to a clock;
    decoding the first single data rate data to obtain an address of a memory within the DDR PSRAM;
    obtaining data stored in the address of the memory; and
    providing a double data rate data to the controller via the common bus in response to a data strobe signal according to the obtained data,
    wherein the controller receives the double data rate data according to the data strobe signal.

11. The data reading method as claimed in claim 10, wherein the first single data rate data is received in a command phase, and the double data rate data is transmitted in a read data phase.

12. The data reading method as claimed in claim 10, wherein the data stored in the address of the memory comprises a plurality of data units that are divided into a first group and a second group, and the step of providing the double data rate data to the controller via the common bus in response to the data strobe signal according to the obtained data further comprises:

providing the data units of the first group in response to a rising edge of the data strobe signal as the double data rate data; and providing the data units of the second group in response to a falling edge of the data strobe signal as the double data rate data.

13. The data reading method as claimed in claim 10, further comprises:

providing a second single data rate data to the controller in response to the clock via the common bus according to the obtained data in a read data phase when a control signal indicates that the DDR PSRAM is operated in a single data rate mode; and providing the double data rate data to the controller in response to the data strobe signal according to the obtained data in the read data phase when the control signal indicates that the DDR PSRAM is operated in a double data rate mode, wherein the controller receives the second single data rate data according to the clock.

14. The data reading method as claimed in claim 10, further comprising:

providing a wait signal to the controller;

de-asserting the wait signal after a read command from the controller has been accepted; and asserting the wait signal when the double data rate data is ready to be transmitted to the controller, wherein the wait signal is assigned to a high-impedance until the read command from the controller is accepted.

15. The data reading method as claimed in claim 14, further comprising:

assigning the data strobe signal to a high-impedance until the read command from the controller is accepted; and de-asserting the data strobe signal after the read command from the controller is accepted or after the wait signal is asserted according to a control signal.

* * * * *